United States Patent
Huang et al.

(10) Patent No.: US 9,328,873 B2
(45) Date of Patent: May 3, 2016

(54) LIGHT BULB HAVING LIGHT EMITTING DIODES CONNECTED TO AT LEAST TWO CIRCUIT BOARDS

(71) Applicants: Tai-Hsiang Huang, Tainan (TW); Kuan-Hsiang Huang, Tainan (TW)

(72) Inventors: Tai-Hsiang Huang, Tainan (TW); Kuan-Hsiang Huang, Tainan (TW)

(*) Notice: Subject to any disclaimer, the term of this patent is extended or adjusted under 35 U.S.C. 154(b) by 56 days.

(21) Appl. No.: 14/221,463

(22) Filed: Mar. 21, 2014

(65) Prior Publication Data

US 2015/0267872 A1   Sep. 24, 2015

(51) Int. Cl.
*F21K 99/00*   (2010.01)
*H05K 1/00*   (2006.01)
*F21Y 101/02*   (2006.01)
*F21Y 111/00*   (2016.01)

(52) U.S. Cl.
CPC ...... *F21K 9/135* (2013.01); *H05K 1/00* (2013.01); *F21Y 2101/02* (2013.01); *F21Y 2111/005* (2013.01); *F21Y 2111/007* (2013.01)

(58) Field of Classification Search
None
See application file for complete search history.

(56) References Cited

U.S. PATENT DOCUMENTS

| | | | |
|---|---|---|---|
| 5,806,965 A * | 9/1998 | Deese | 362/249.04 |
| 6,425,678 B1 * | 7/2002 | Verdes et al. | 362/244 |
| 6,991,351 B1 * | 1/2006 | Petrick | 362/373 |
| 7,014,337 B2 * | 3/2006 | Chen | 362/240 |
| 7,568,817 B2 * | 8/2009 | Lee et al. | 362/294 |
| 8,536,807 B2 * | 9/2013 | Lin et al. | 315/358 |
| 8,545,056 B2 * | 10/2013 | Kajiya et al. | 362/249.04 |
| 8,860,309 B2 * | 10/2014 | Huang | 315/35 |
| 8,950,899 B2 * | 2/2015 | Chien | 362/249.03 |
| 2004/0114367 A1 * | 6/2004 | Li | 362/248 |
| 2009/0109674 A1 * | 4/2009 | Lodhie | 362/249.02 |
| 2010/0314985 A1 * | 12/2010 | Premysler | 313/46 |
| 2011/0248631 A1 * | 10/2011 | Chuang | 315/32 |
| 2011/0286200 A1 * | 11/2011 | Iimura et al. | 362/84 |
| 2012/0040585 A1 * | 2/2012 | Huang | 445/43 |
| 2014/0240990 A1 * | 8/2014 | Bae | 362/294 |
| 2014/0247601 A1 * | 9/2014 | Takamitsu | 362/307 |
| 2014/0268771 A1 * | 9/2014 | Heikman | 362/249.02 |

FOREIGN PATENT DOCUMENTS

DE   202014101529 U1 *   6/2014

* cited by examiner

*Primary Examiner* — Britt D Hanley
(74) *Attorney, Agent, or Firm* — Rosenberg, Klein & Lee

(57) ABSTRACT

A light bulb includes a glass bulb having a top part and a bottom part which is connected to the top part. A light unit is located in a space defined between the top and bottom parts. The light unit has a transverse circuit board and at least one upright circuit board. Multiple Light Emitting Diodes are connected to the top surface and the bottom surface of the transverse circuit board. The at least one upright circuit board is connected to the top surface of the transverse circuit board. Multiple Light Emitting Diodes are connected to the outside surface of the at least one upright circuit board. The light beams from the Light Emitting Diodes go through the glass bulb and toward different directions.

4 Claims, 4 Drawing Sheets

LIGHT BULB HAVING LIGHT EMITTING DIODES CONNECTED TO AT LEAST TWO CIRCUIT BOARDS

BACKGROUND OF THE INVENTION

1. Fields of the Invention

The present invention relates to a light bulb, and more particularly, to a light bulb with Light Emitting Diodes connected to two circuit boards which are installed in different orientations so as to provide wider illumination feature.

2. Descriptions of Related Art

The conventional light bulb with Light Emitting Diodes (LEDs) is used widely for their illumination efficiency and energy-saving features. The LEDs are compact in size and have longer period of life, the response period is short and durable in vibration, so that LEDs gradually replace filaments.

The LEDs are installed to the conventional glass bulbs to replace the filaments, and the conventional glass bulbs are designed to be cooperated with most of the light units which have reflection/refraction panels to guide and send the light beams to the desired directions. Therefore, the LEDs are usually installed on a circuit board, by the arrangement of the LEDS, the light beams meet the requirements of the conventional light units.

However, the conventional way to install the LEDs on the surface of the circuit board can only arrange the LEDs on a flat surface, in other words, the light beams from the LEDs on the surface can only be sent toward one direction. The light beams cannot be sent to a rage of 360 degrees.

The present invention intends to provide a light bulb which has a transverse circuit and an upright circuit board, each circuit board has multiple LEDs connected thereto so as to improve the shortcomings mentioned above.

SUMMARY OF THE INVENTION

The present invention relates to a light bulb and comprises a glass bulb having a top part and a bottom part which is connected to the top part. A light unit is located in a space defined between the top and bottom parts. The light unit has a transverse circuit board and at least one upright circuit board. Multiple Light Emitting Diodes are connected to the top surface and the bottom surface of the transverse circuit board. The at least one upright circuit board is connected to the top surface of the transverse circuit board. Multiple Light Emitting Diodes are connected to the outside surface of the at least one upright circuit board.

Preferably, a secondary transverse circuit board is connected to the top end of the at least one upright circuit board, and multiple Light Emitting Diodes are connected to the top surface of the secondary transverse circuit board.

Preferably, there are multiple upright circuit boards connected to the top surface of the transverse circuit board, and the multiple upright circuit boards are arranged side-by-side to form as an elongate post.

The primary object of the present invention is to provide a light bulb wherein the Light Emitting Diodes are connected to the transverse circuit board and the upright circuit board so that the light beams from the Light Emitting Diodes go through the glass bulb and toward different directions.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENT

Figure 1:
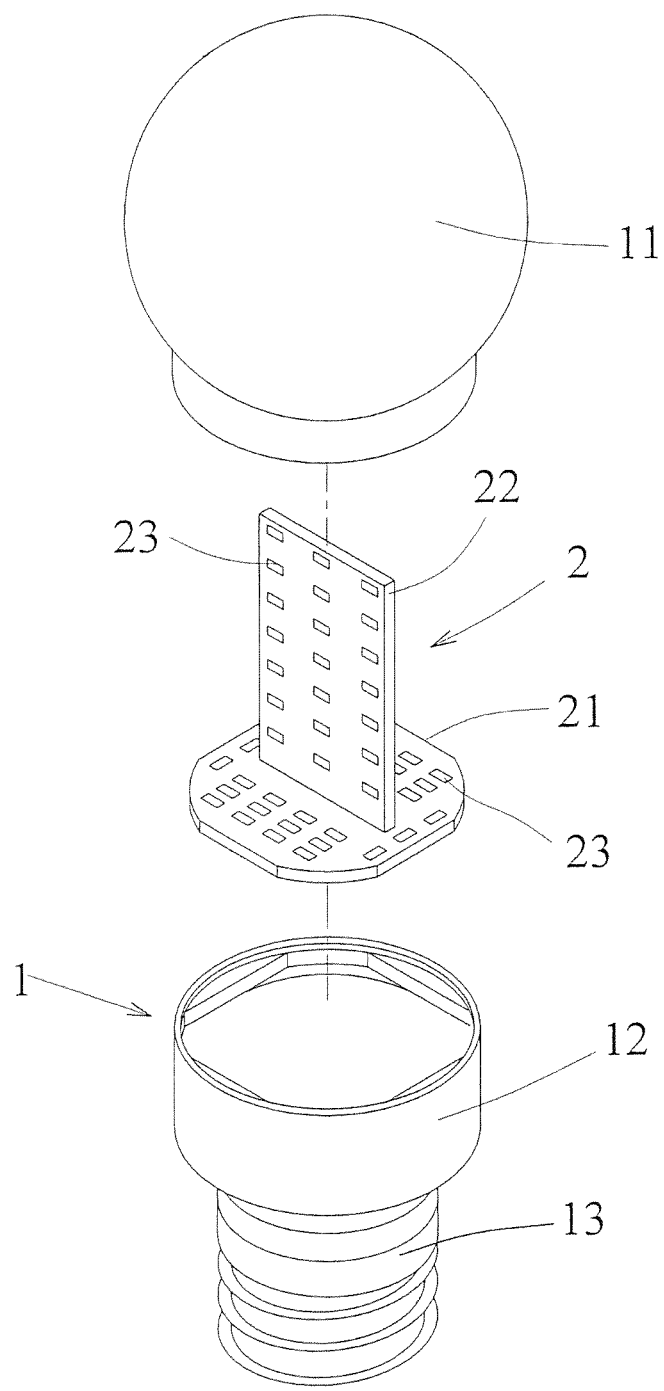
FIG. 1 is an exploded view to show the light bulb of the present invention.
Figure 2:
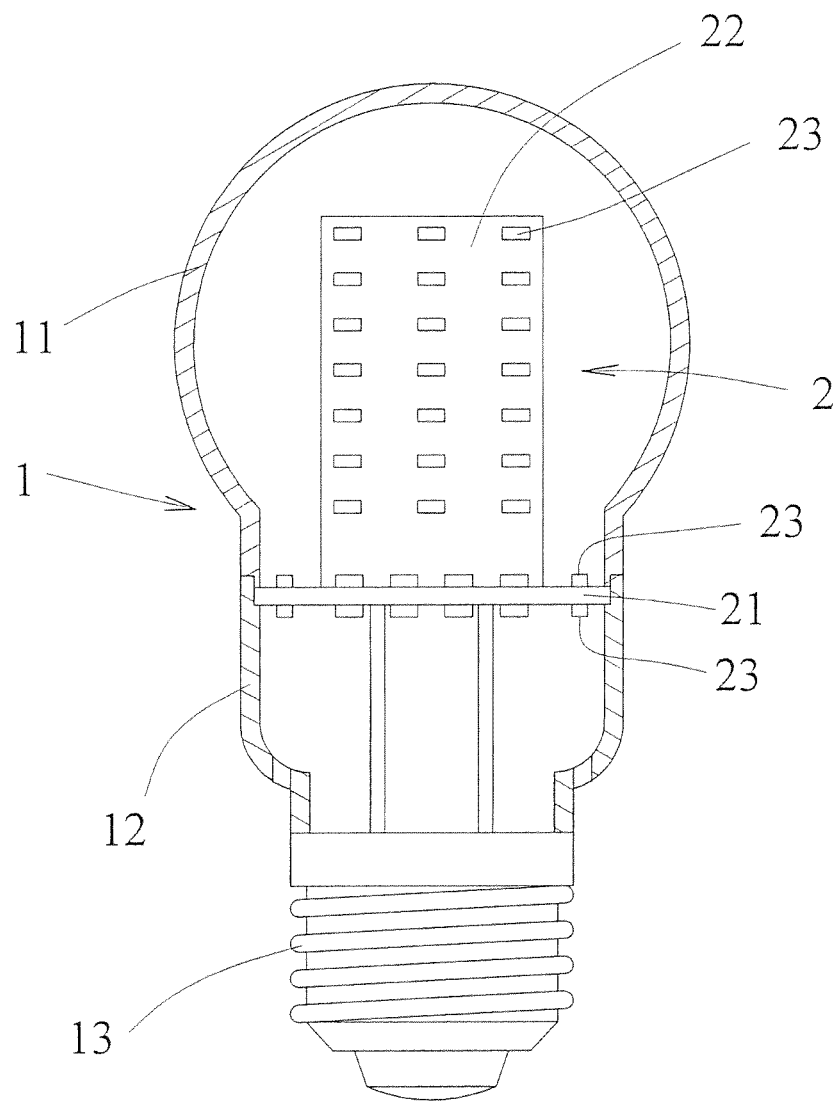
FIG. 2 is a cross sectional view of the light bulb of the present invention.

Referring to FIGS. 1 and 2, the light bulb of the present invention comprises a glass bulb 1 and a light unit 2. The glass bulb 1 has a top part 11 and a bottom part 12 which is connected to the top part 11 so as to define a space between the top and bottom parts 11, 12. The light unit 2 is located in the space. The bottom part 12 is connected to a screw cap 13 which is electrically connected with the light unit 2. Electric power is supplied to the light unit via the screw cap 13.

The light unit 2 has a transverse circuit board 21 and an upright circuit board 22. Multiple Light Emitting Diodes 23 are connected to the top surface and the bottom surface of the transverse circuit board 21. The upright circuit board 22 is connected to the top surface of the transverse circuit board 21. Multiple Light Emitting Diodes 23 are connected to the outside surface of the upright circuit board 22.

Figure 3:
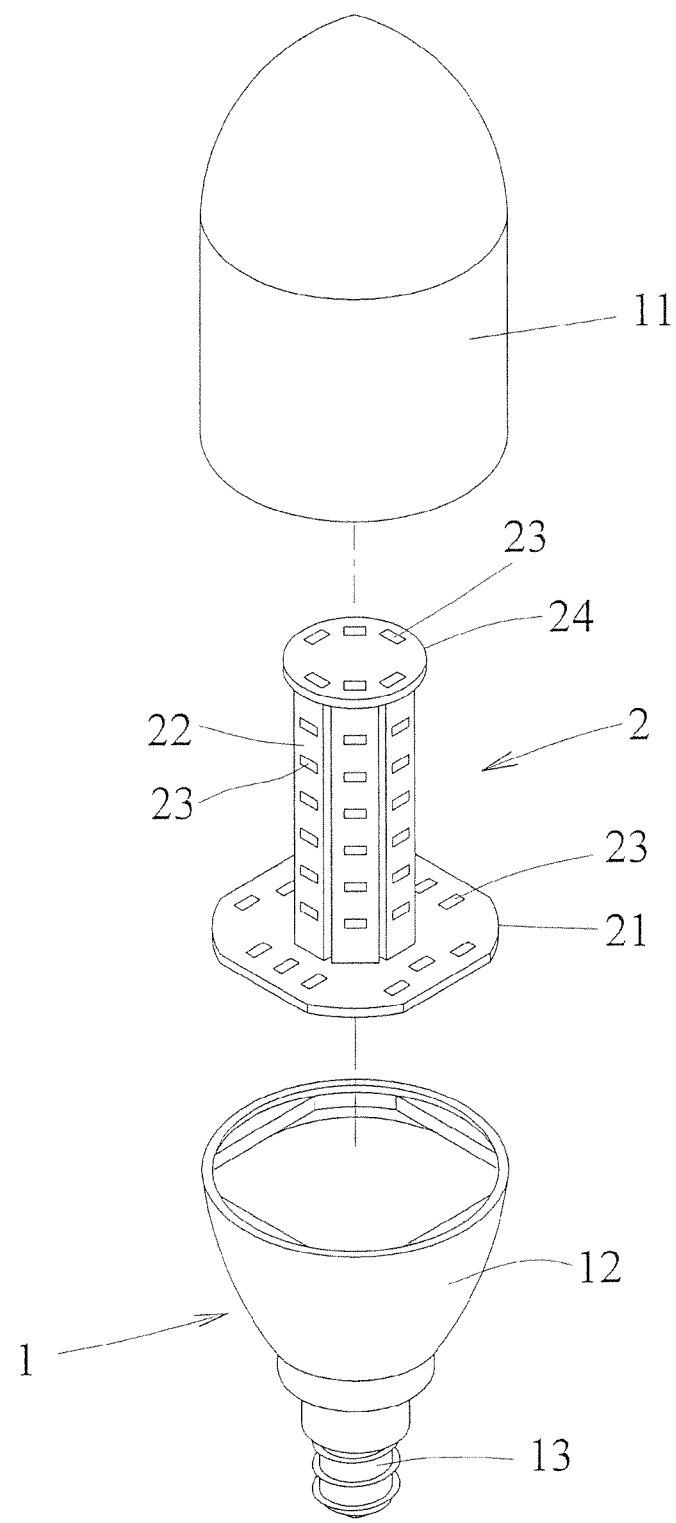
FIG. 3 is an exploded view to show the second embodiment of the light bulb of the present invention.
Figure 4:
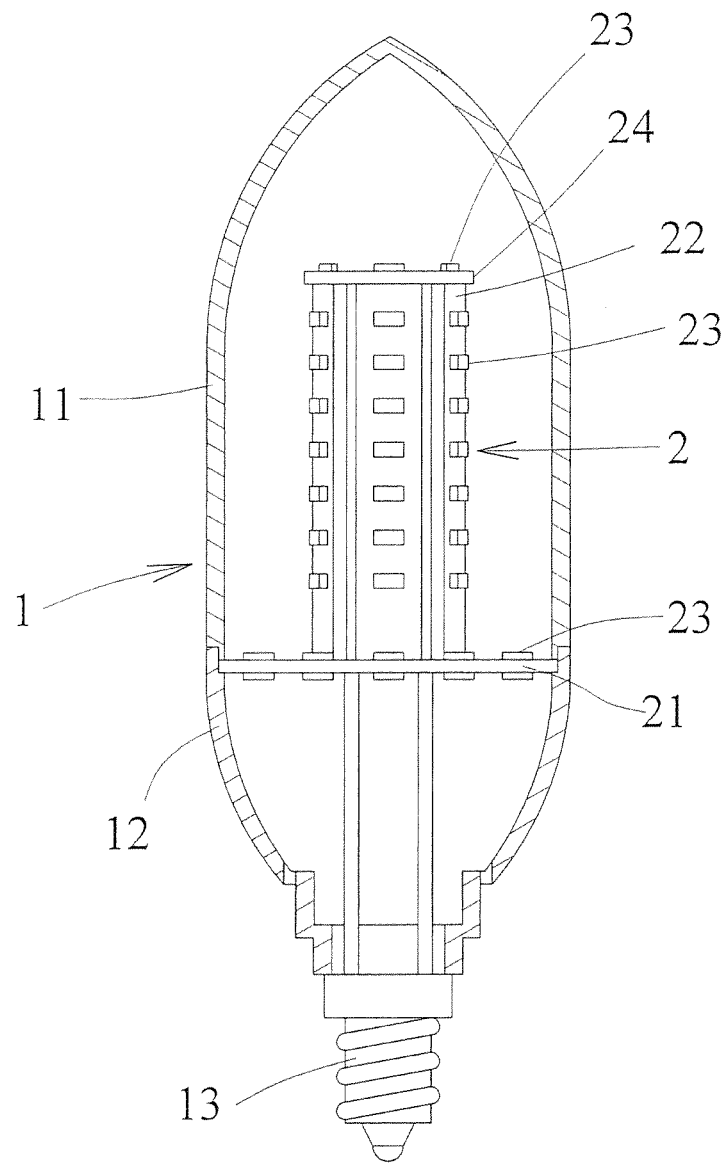
FIG. 4 is a cross sectional view of the second embodiment of the light bulb of the present invention.

FIGS. 3 and 4 show the second embodiment of the light bulb of the present invention, there are multiple upright circuit boards 22 connected to the top surface of the transverse circuit board 21. The multiple upright circuit boards 22 are arranged side-by-side to form as an elongate post. Multiple Light Emitting Diodes 23 are connected to the top surface and the bottom surface of the transverse circuit board 21. Multiple Light Emitting Diodes 23 are connected to the outside surface of each of the upright circuit boards 22. A secondary transverse circuit board 24 is connected to the top end of the multiple upright circuit boards 22. Multiple Light Emitting Diodes 23 are connected to the top surface of the secondary transverse circuit board 24.

The light unit 2 is located in the space of the glass bulb 1 and electrically connected with the screw cap 13 so that when the electric power is supplied to the light unit 2, all of the Light Emitting Diodes 23 are activated to generate light beams which go toward different directions to provide better illumination feature.

The light bulb of the present invention comprises a transverse circuit board 21 and at least one upright circuit board 22. Multiple Light Emitting Diodes 23 are connected to the top surface and the bottom surface of the transverse circuit board 21. Multiple Light Emitting Diodes 23 are connected to the outside surface of the at least one upright circuit board 22. Furthermore, a secondary transverse circuit board 24 is connected to the top end of the at least one upright circuit board 22. And multiple Light Emitting Diodes 23 are connected to the top surface of the secondary transverse circuit board 24. The light bulb of the present invention provides the light beams to cover an area almost 360 degrees.

While we have shown and described the embodiment in accordance with the present invention, it should be clear to those skilled in the art that further embodiments may be made without departing from the scope of the present invention.

What is claimed is:

1. A light bulb comprising:
    a glass bulb connected to a screw base, the glass bulb having a light-transmissive top part connected longitudinally above and to a light-transmissive bottom part, and the light-transmissive top and bottom parts defining an interior chamber therein, and
    a light unit located in the interior chamber, the light unit and having a first circuit board and at least one second circuit board connected to the first circuit board, the at least one second circuit board extending longitudinally within an upper portion of the interior chamber, and the first circuit board extending transversely relative to the at least one second circuit board, the first circuit board having multiple Light Emitting Diodes disposed on a top surface and a bottom surface thereof, the at least one second circuit board being connected to the top surface of the first circuit board, multiple Light Emitting Diodes disposed on an outside surface of the at least one second circuit board, light emitted by at least the multiple Light Emitting Diodes disposed on the bottom surface of the first circuit board being emitted into a bottom portion of the interior chamber and through the light-transmissive bottom part.

2. The light bulb as claimed in claim 1, wherein an additional first circuit board is connected to a top end of the at least one second circuit board, multiple Light Emitting Diodes being connected to a top surface of the additional first circuit board.

3. The light bulb as claimed in claim 1, wherein multiple second circuit boards are connected to the top surface of the first circuit board, the multiple second circuit boards being arranged side-by-side to form an elongate post.

4. The light bulb as claimed in claim 3, wherein an additional first circuit board is connected to a top end of the at least one second circuit board, multiple Light Emitting Diodes being connected to a top surface of the additional first circuit board.

* * * * *